United States Patent
Tan et al.

(10) Patent No.: US 10,592,057 B1
(45) Date of Patent: Mar. 17, 2020

(54) TWO LAYER FORCEPAD

(71) Applicant: Synaptics Incorporated, San Jose, CA (US)

(72) Inventors: Yeh-Cheng Tan, Taipei (TW); Yu-Hsin Chen, Taipei (TW)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 16/189,592

(22) Filed: Nov. 13, 2018

(51) Int. Cl.
*G06F 3/044* (2006.01)
*H03K 17/955* (2006.01)
*G06F 3/041* (2006.01)
*H03K 17/96* (2006.01)

(52) U.S. Cl.
CPC ............ *G06F 3/044* (2013.01); *G06F 3/0414* (2013.01); *H03K 17/955* (2013.01); *H03K 17/962* (2013.01); *G06F 2203/04106* (2013.01); *G06F 2203/04107* (2013.01)

(58) Field of Classification Search
CPC ...... G06F 3/044; G06F 3/0414; G06F 3/0412; G06F 3/0416; G06F 2203/04106; G06F 2203/04107; G06F 2203/04105; H03K 17/955; H03K 17/962; G02F 1/13338
See application file for complete search history.

(56) References Cited

U.S. PATENT DOCUMENTS

| | | | | |
|---|---|---|---|---|
| 8,947,366 B2* | 2/2015 | Chien | ..................... | G06F 3/044 178/18.01 |
| 9,304,643 B2* | 4/2016 | Jordan | ..................... | G06F 3/044 |
| 9,785,296 B2* | 10/2017 | Lee | .......................... | G06F 3/044 |
| 2004/0239650 A1* | 12/2004 | MacKey | ................. | G06F 3/044 345/174 |
| 2006/0012944 A1* | 1/2006 | Mamigonians | ......... | G06F 3/044 361/303 |
| 2006/0066581 A1* | 3/2006 | Lyon | ....................... | G06F 3/044 345/173 |
| 2008/0309633 A1* | 12/2008 | Hotelling | .............. | G06F 3/0412 345/173 |
| 2009/0085885 A1* | 4/2009 | Wu | .......................... | G06F 3/041 345/173 |
| 2009/0213090 A1* | 8/2009 | Mamba | .................... | G06F 3/044 345/174 |

(Continued)

*Primary Examiner* — Christopher E Leiby
(74) *Attorney, Agent, or Firm* — Ferguson Braswell Fraser Kubasta PC

(57) ABSTRACT

An input device sensor includes proximity receiver electrodes on a first single layer, force receiver electrodes on a second single layer, and transmitter electrodes configured to transmit a transmitter signal. Each transmitter electrode includes proximity transmitter segments linearly arranged on the first single layer and separated by the proximity receiver electrodes. The transmitter electrodes further each include force transmitter segments linearly arranged on the second single layer and separated by the force receiver electrodes, the force transmitter segments connecting adjacent proximity transmitter segments in the proximity transmitter segments. The input device sensor further includes a first ground shield on the first single layer, the first ground shield shielding the force receiver electrodes from the proximity transmitter segments. The input device sensor further includes a ground plane, and a compressible layer interposed between the second single layer and the ground plane.

20 Claims, 12 Drawing Sheets

(56) References Cited

U.S. PATENT DOCUMENTS

| | | | |
|---|---|---|---|
| 2009/0314621 A1* | 12/2009 | Hotelling | G06F 3/0416 200/600 |
| 2010/0110038 A1* | 5/2010 | Mo | G06F 3/044 345/174 |
| 2011/0063251 A1* | 3/2011 | Geaghan | G06F 3/044 345/174 |
| 2011/0175671 A1* | 7/2011 | Reynolds | G06F 3/044 327/517 |
| 2012/0038583 A1* | 2/2012 | Westhues | G06F 3/0412 345/174 |
| 2012/0222498 A1* | 9/2012 | Mamigonians | G01L 1/142 73/862.626 |
| 2013/0015868 A1* | 1/2013 | Peng | G06F 3/044 324/688 |
| 2013/0050139 A1* | 2/2013 | Gute | G06F 1/1626 345/174 |
| 2013/0088448 A1* | 4/2013 | Seo | G06F 3/0488 345/173 |
| 2013/0257785 A1* | 10/2013 | Brown | G06F 3/044 345/174 |
| 2014/0009428 A1* | 1/2014 | Coulson | G06F 3/044 345/174 |
| 2014/0062933 A1* | 3/2014 | Coulson | G06F 3/044 345/174 |
| 2014/0062934 A1* | 3/2014 | Coulson | G06F 3/044 345/174 |
| 2014/0267128 A1* | 9/2014 | Bulea | G06F 3/044 345/174 |
| 2015/0179122 A1* | 6/2015 | Brown | G06F 3/0416 345/174 |
| 2016/0062505 A1* | 3/2016 | Hwang | G06F 3/0412 345/174 |
| 2016/0357331 A1* | 12/2016 | Kano | G06F 3/044 |
| 2017/0045992 A1* | 2/2017 | Lee | G06F 3/0416 |
| 2017/0060340 A1* | 3/2017 | Chen | G06F 3/0412 |
| 2017/0075493 A1* | 3/2017 | Lee | G06F 3/0418 |
| 2019/0073076 A1* | 3/2019 | Kuo | G06F 3/0414 |
| 2019/0339805 A1* | 11/2019 | Suzuki | G06F 3/0416 |

* cited by examiner

– 1 –

TWO LAYER FORCEPAD

FIELD

This invention generally relates to electronic devices.

BACKGROUND

Input devices that include both proximity and force detection, (e.g., touchpads, forcepads, or other such devices), are widely used in a variety of electronic systems. Input devices may include a sensing region, often demarked by a surface. In the sensing region, the input device determines the presence, location, motion, and/or force of one or more input objects. Input devices may be used to provide interfaces for the electronic system. For example, input devices may be used for larger computing systems (e.g., opaque touchpads integrated in, or peripheral to, notebook or desktop computers), and used in smaller computing systems (e.g., touch screens integrated in cellular phones).

SUMMARY

In general, in one aspect, one or more embodiments relate to an input device sensor that includes proximity receiver electrodes on a first single layer, force receiver electrodes on a second single layer, and transmitter electrodes configured to transmit a transmitter signal. Each transmitter electrode includes proximity transmitter segments linearly arranged on the first single layer and separated by the proximity receiver electrodes, the proximity transmitter segments capacitively coupled to the proximity receiver electrodes. The transmitter electrodes further each include force transmitter segments linearly arranged on the second single layer and separated by the force receiver electrodes, the force transmitter segments connecting adjacent proximity transmitter segments in the proximity transmitter segments, the force transmitter segments capacitively coupled to the force receiver electrodes. The input device sensor further includes a first ground shield on the first single layer, the first ground shield shielding the force receiver electrodes from the proximity transmitter segments. The input device sensor further includes a ground plane, and a compressible layer interposed between the second single layer and the ground plane.

In general, in one aspect, one or more embodiments relate to a method for manufacturing an input device sensor. The method includes printing, on a film, a first single layer. The first single layer includes proximity receiver electrodes, proximity transmitter segments separated by the proximity receiver electrodes, the proximity transmitter segments capacitively coupled to the proximity receiver electrodes, and a first ground shield. The method further includes printing, on the film, a second single layer. The second single layer includes force receiver electrodes, where the force receiver electrodes is shielded from the proximity transmitter segments, and force transmitter segments and separated by the force receiver electrodes, the force transmitter segments connecting adjacent proximity transmitter segments in the proximity transmitter segments, the force transmitter segments capacitively coupled to the force receiver electrodes. The method further includes affixing, to the input device sensor, a ground plane and a compressible layer interposed between the second single layer and the ground plane.

In general, in one aspect, one or more embodiments relate to an input device that includes an input surface and an input device sensor. The input device sensor includes proximity receiver electrodes on a first single layer, force receiver electrodes on a second single layer, and transmitter electrodes configured to transmit a transmitter signal. Each transmitter electrode includes proximity transmitter segments linearly arranged on the first single layer and separated by the proximity receiver electrodes, the proximity transmitter segments forming a first capacitive coupling with the proximity receiver electrodes, and force transmitter segments linearly arranged on the second single layer and separated by the force receiver electrodes, the force transmitter segments connecting adjacent proximity transmitter segments in the proximity transmitter segments, the force transmitter segments forming a second capacitive coupling with the force receiver electrodes. The input device sensor further includes a first ground shield on the first single layer, the first ground shield shielding the force receiver electrodes from the proximity transmitter segments, a ground plane, and a compressible layer interposed between the second single layer and the ground plane. The first single layer and the second single layer are printed on a film. The input device further includes a processing circuitry configured to determine positional information of an input object proximate to the input surface based on the first capacitive coupling, and determine a force applied to the input surface based on the second capacitive coupling.

Other aspects of the invention will be apparent from the following description and the appended claims.

BRIEF DESCRIPTION OF DRAWINGS

Exemplary embodiments will be described in conjunction with the appended drawings, where like designations denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

In the following detailed description of embodiments, numerous specific details are set forth in order to provide a more thorough understanding of the disclosed technology. However, it will be apparent to one of ordinary skill in the art that the disclosed technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Various embodiments of the present invention provide input devices and methods that facilitate improved usability while satisfying thickness constraints on the input device. In particular, one or more embodiments is directed to a two-layer input device design having both proximity and force detection capabilities. Proximity detection detects the location of input objects in relation to the sensing region. Force detection detects an amount of force applied by one or more input objects in the sensing region. In the two-layer design, proximity receiver electrodes are located on a first single layer, force receiver electrodes are location in a second single layer. Transmitter electrodes have segments on both the first single layer and the second single layer. Using the arrangement of electrodes describe, one or more embodiments may achieve a thinner design than a three-layer arrangement of electrodes.

Figure 1:
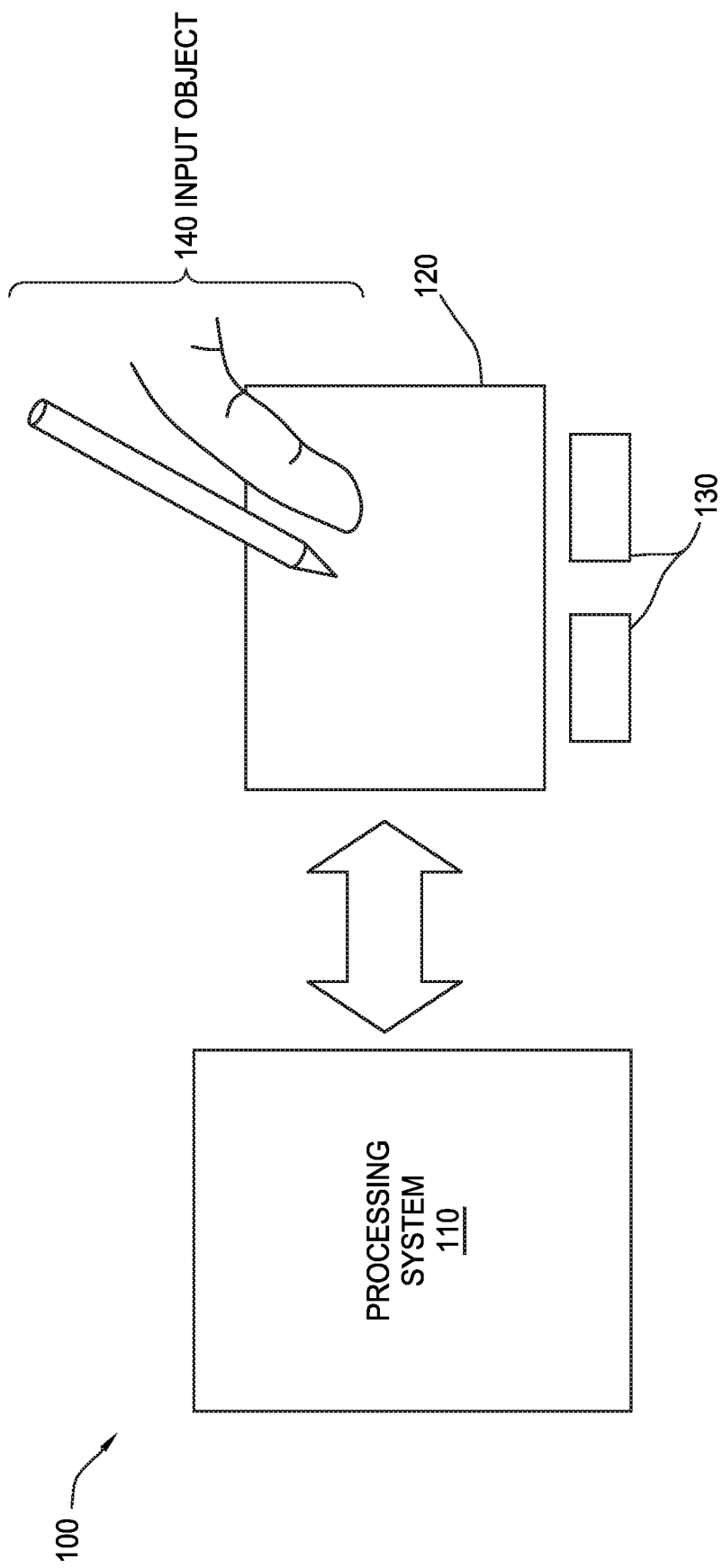
FIG. 1 is a block diagram of an example system that includes an input device in accordance with an embodiment of the disclosure.

Turning now to the figures, FIG. 1 shows a block diagram of an exemplary input device (100), in accordance with embodiments of the disclosure. The input device (100) may be configured to provide input to an electronic system (not shown for simplicity). As used in this document, the term "electronic system" (or "electronic device") broadly refers to any system capable of electronically processing information. Examples of electronic systems may include personal computers of all sizes and shapes (e.g., desktop computers, laptop computers, netbook computers, tablets, web browsers, e-book readers, and personal digital assistants (PDAs)), composite input devices (e.g., physical keyboards, joysticks, and key switches), data input devices (e.g., remote controls and mice), data output devices (e.g., display screens and printers), remote terminals, kiosks, video game machines (e.g., video game consoles, portable gaming devices, and the like), communication devices (e.g., cellular phones, such as smart phones), and media devices (e.g., recorders, editors, and players such as televisions, set-top boxes, music players, digital photo frames, and digital cameras). Additionally, the electronic system could be a host or a slave to the input device.

The input device (100) may be implemented as a physical part of the electronic system. In the alternative, the input device (100) may be physically separate from the electronic system. The input device (100) may be coupled to (and communicate with) components of the electronic system using various wired or wireless interconnections and communication technologies, such as buses and networks. Example technologies may include Inter-Integrated Circuit (I2C), Serial Peripheral Interface (SPI), PS/2, Universal Serial Bus (USB), Bluetooth®, Infrared Data Association (IrDA), and various radio frequency (RF) communication protocols defined by the IEEE 802.11 or other standards.

In the example of FIG. 1, the input device (100) may correspond to a proximity sensor device (such as a "touchpad" or a "touch sensor device") configured to sense input provided by one or more input objects (140) in a sensing region (120). Example input objects include fingers and styli. The sensing region (120) may encompass any space above, around, in and/or near the input device (100) in which the input device (100) is able to detect user input (e.g., provided by one or more input objects (140)). The sizes, shapes, and locations of particular sensing regions may vary depending on actual implementations.

In some embodiments, the sensing region (120) extends from a surface of the input device (100) in one or more directions into space, for example, until a signal-to-noise ratio falls below a threshold suitable for object detection. For example, the distance to which this sensing region (120) extends in a particular direction, in various embodiments, may be on the order of less than a millimeter, millimeters, centimeters, or more, and may vary with the type of sensing technology used and/or the accuracy desired. In some embodiments, the input device (100) detects inputs involving no physical contact with any surfaces of the input device (100), contact with an input surface (e.g. a touch surface) of the input device (100), contact with an input surface of the input device (100) coupled with some amount of applied force or pressure, and/or a combination thereof.

In various embodiments, input surfaces may be provided by surfaces of a housing of the input device (100) within which the sensor electrodes reside, by face sheets applied over the sensor electrodes or any casings, etc. In some embodiments, the sensing region (120) has a rectangular shape when projected onto an input surface of the input device (100).

The input device (100) uses transcapacitance (Also referred to as "transcapacitance") sensing technologies. Transcapacitance sensing methods detect changes in the capacitive coupling between sensor electrodes. For example, an input object or ground near the sensor electrodes may alter the electric field between the sensor electrodes, thus changing the measured capacitive coupling of the sensor electrodes. In some embodiments, the input device (100) may implement transcapacitance sensing by detecting the capacitive coupling between one or more transmitter sensor electrodes (also "transmitter electrodes" or "transmitter") and one or more receiver sensor electrodes (also "receiver electrodes" or "receiver"). Signals on the transmitter sensor electrodes may be modulated relative to a reference voltage (e.g., system ground) to transmit transmitter signals while receiver sensor electrodes may be held at a substantially constant voltage relative to the reference voltage to receive resulting signals. The reference voltage may be a substantially constant voltage or may be system ground. The resulting signal may be affected by environmental interference (e.g., other electromagnetic signals) as well as input objects or ground in contact with, or in close proximity to, the sensor electrodes.

The processing system (110) may be configured to operate the hardware of the input device (100) to detect input in the sensing region (120). The processing system (110) may include parts of, or all of, one or more integrated circuits (ICs) and/or other circuitry components. For example, a processing system for a mutual capacitance sensor device may include transmitter circuitry configured to transmit signals with transmitter sensor electrodes, and/or receiver circuitry configured to receive signals with receiver sensor electrodes.

In some embodiments, the processing system (110) also includes electronically-readable instructions, such as firmware code, software code, and/or the like. In some embodiments, components composing the processing system (110) are located together, such as near sensing element(s) of the input device (100). In other embodiments, components of processing system (110) are physically separate with one or more components close to the sensing element(s) of the input device (100), and one or more components elsewhere. For example, the input device (100) may be a peripheral coupled to a computing device, and the processing system (110) may include software configured to run on a central processing unit of the computing device and one or more ICs (perhaps with associated firmware) separate from the central processing unit. As another example, the input device (100) may be physically integrated in a mobile device, and the processing system (110) may include circuits and firmware that are part of a main processor of the mobile device. In some embodiments, the processing system (110) is dedicated to implementing the input device (100). In other embodiments, the processing system (110) also performs other functions, such as operating display screens, driving haptic actuators, etc. In some embodiments, the processing system (110) may include processing circuitry configured to determine when at least one input object is in a sensing region, determine signal to noise ratio, determine positional information of an input object, determine force applied to the input surface, identify a gesture, determine an action to perform based on the gesture, a combination of gestures or other information, and/or perform other operations. In some embodiments, the processing system (110) may include sensor circuitry configured to drive the sensing elements to transmit transmitter signals and receive the resulting signals. In some embodiments, the sensor circuitry (160) may include sensory circuitry that is coupled to the sensing elements. The sensory circuitry may include, for example, a transmitter module including transmitter circuitry that is coupled to a transmitting portion of the sensing elements and a receiver module including receiver circuitry coupled to a receiving portion of the sensing elements.

The receiver circuitry is configured to receive capacitive resulting signals that include the capacitive effects of the transmitter signals and input object and/or ground. The processing circuitry is configured to obtain measurements of the capacitive resulting signals and, using the measurements determine positional information and force information. "Positional information" as used herein broadly encompasses absolute position, relative position, velocity, acceleration, and other types of spatial information. "Force information" as used herein broadly encompasses an amount of force applied by the input surface, an amount of displacement of the input surface, or any other indicator of force.

While FIG. 1 shows a configuration of components, other configurations may be used without departing from the scope of the disclosure. For example, various components may be combined to create a single component. As another example, the functionality performed by a single component may be performed by two or more components.

Figure 2:
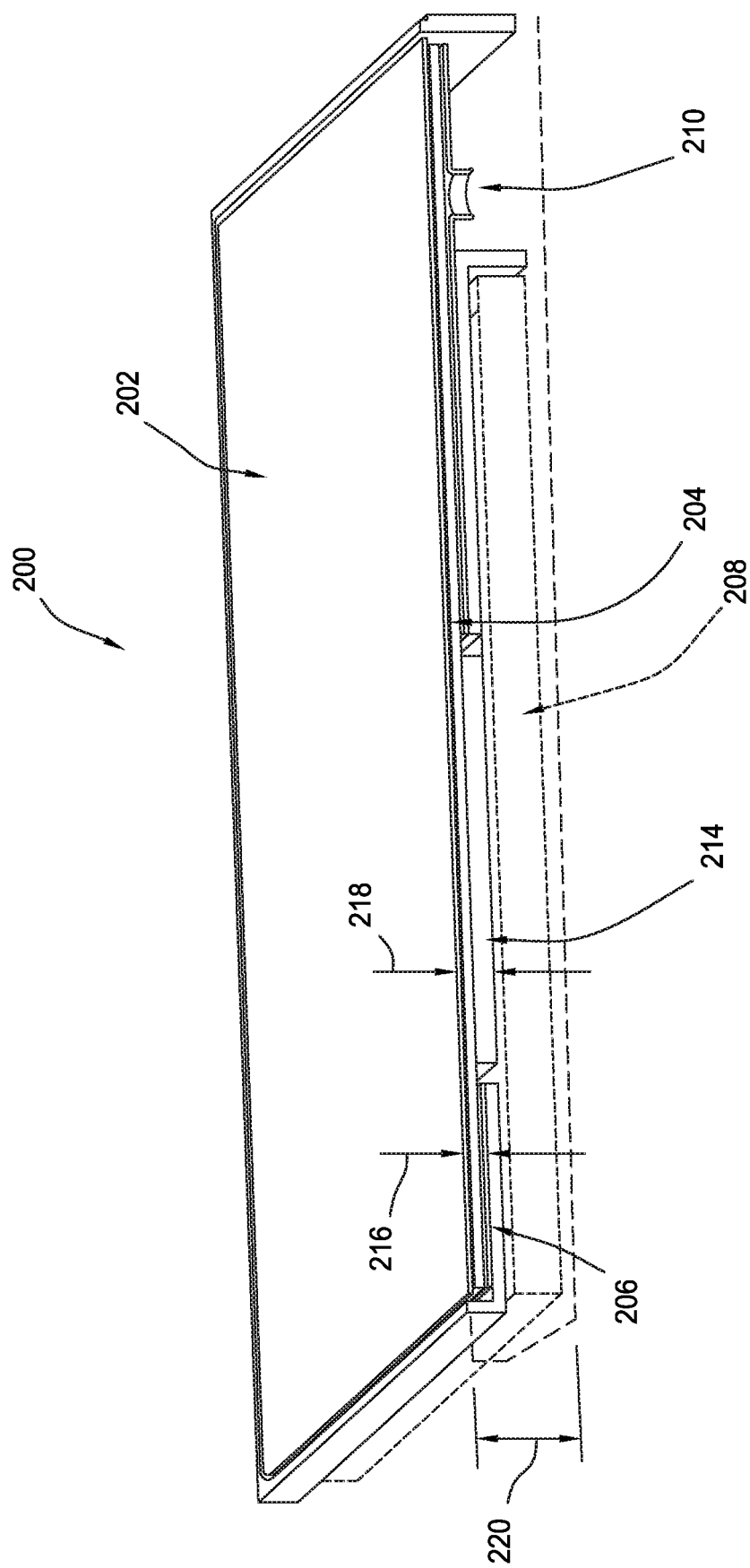
FIG. 2 is an example perspective diagram of an input device in accordance with an embodiment of the disclosure.

FIG. 2 is an example perspective diagram of an input device when the input device is a force pad (200) in accordance with an embodiment of the disclosure. Although FIG. 2 shows a force pad, the input device may be a different device, such as a touch screen, without departing from the scope of the claims. For example, the force pad (200) may be a standalone input device or a part of another input device or computer, such as a laptop computer. As shown in FIG. 2, the force pad (200) may include an input surface (202), a sensor component (204), electrical components (214), support brackets (206), battery pack (208), and haptics engine (210).

The input surface (202) is the touch surface of the force pad that may be touched by an input object during operation of the force pad to provide input. The sensor component (204) is a contiguous component having sensor electrodes and other elements to detect proximity and force in the sensing region. The sensor component (204) is a multi-layer component arranged that includes sensing electrodes in two single layers as described below and in FIG. 3. The sensor component is connected to the remaining portion of the input device using electrical components (214). The electrical components (214) may include electrical connection components, such as traces, and the processing circuitry.

The support brackets (206) are one or more physical structures that supports the sensor component (204). For example, the support brackets (206) may be rigid. The battery pack (208) includes a battery to electrically support the input device (202). The haptics engine (210) may include a haptic actuator to provide haptic feedback in response to input.

The height (210) of the force pad may be limited to accommodate narrower computing devices. For example, in the embodiment shown in FIG. 2, a six-millimeter (mm) (220) force pad (200) is shown. The vertical distance (e.g., height) from the top of the input surface (202) to the bottom of the support bracket is 1.2 mm (216). The vertical distance from the top of the input surface (202) to the bottom of the electrical components (214) is 1.8 mm (218). The sensor component (204) and input surface (202) may have a maximum height of 0.8 mm. In the embodiment shown in FIG. 2, to accommodate the limited requirements, one or more embodiments use a minimum number of layers of printed material.

Figure 3:
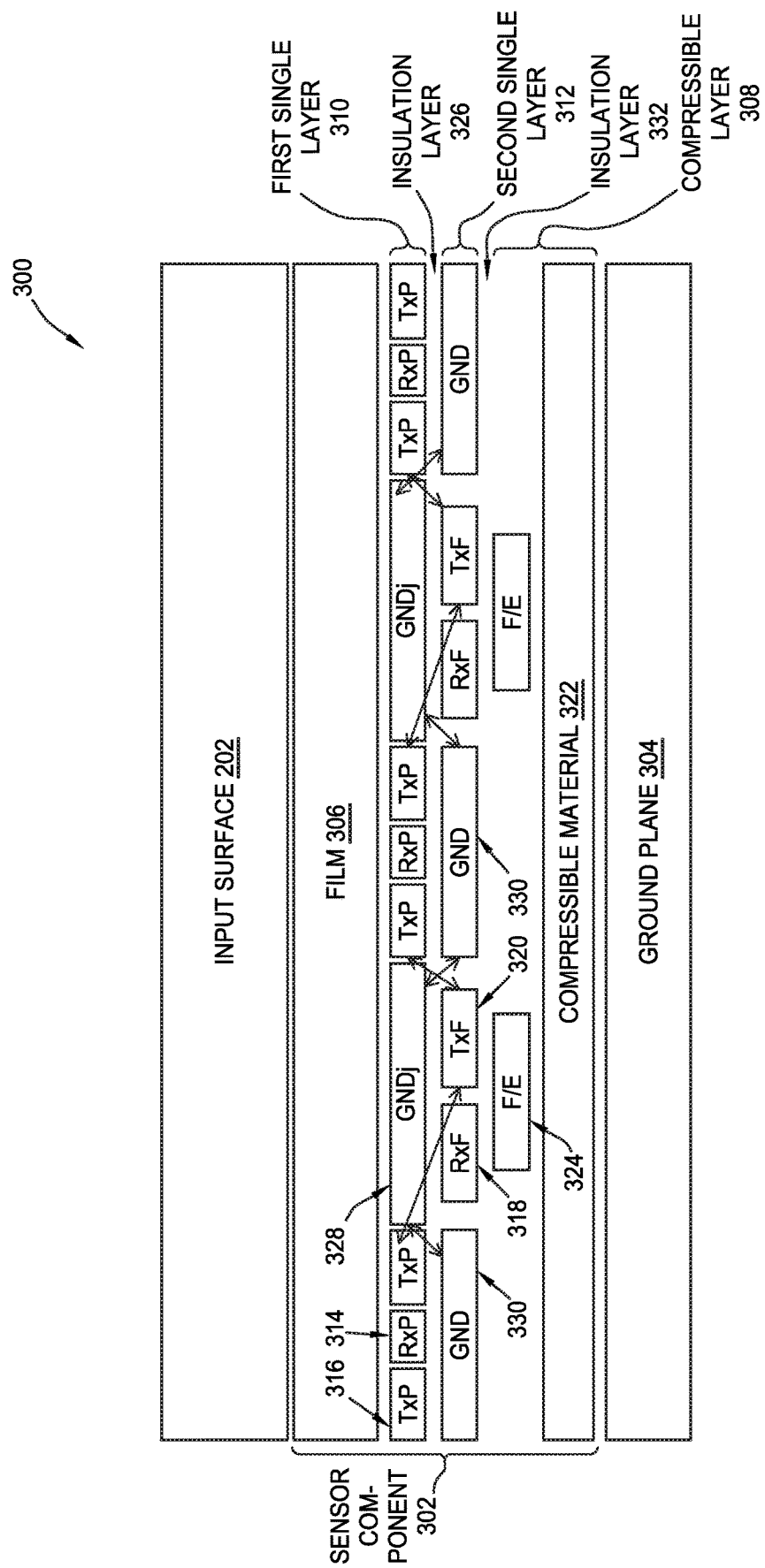
FIG. 3 is a block diagram of a side view of an example input device in accordance with an embodiment of the disclosure.

FIG. 3 is a block diagram of a side view of an example input device (300) in accordance with an embodiment of the disclosure. As shown in FIG. 3, the example input device (300) include multiple layers. At least some of the layers are referred to as a "single layer." The use of the term, "single layer", as used herein means that a single two-dimensional plane may be created that spans the single layer and is touched by each component in the single layer. Additionally, for the term, "single layer", each component is adjacent along the single two-dimensional plane. Therefore, while the height of the components along the single layer may vary, the components are each adjacent.

As shown in FIG. 3, the example input device (300) includes an input surface (202), sensor component (302), and ground plane (304). The input surface (202) may be the same or similar to the input surface described above with reference to FIG. 1 and FIG. 2. The ground plane (304) is a layer of conductive material that is connected to device ground. For example, the ground plane (304) may be the support brackets described above with reference to FIG. 2 or a separate layer of the sensor component. Examples of ground plane (304) includes conductive foil, plate, frame, c-deck, and so forth.

The sensor component (302) includes a film (306) and a compressible layer (308). The film (306) is type of substrate on which the remaining portion of the sensor component may be affixed. In one or more embodiments, the film (306) is a thin layer of flexible material. Example material for the film is Polyethylene Terephthalate (PET).

Interposed between the film (306) and the compressible layer (308) is a first single layer (310) and a second single layer (312). The first single layer may be directly adjacent to the film (306). For example, the first single layer may be directly affixed to the film. The first single layer (310) is configured to perform proximity sensing to obtain positional information. The first single layer (310) includes proximity receiver electrodes (314) and proximity transmitter segments (316). Proximity receiver electrodes (314) are electrodes composed of conductive material that are connected via conductive traces to the processing system (not shown). In one or more embodiments, the proximity receiver electrodes (314) are entirely located on the first single layer (308). The proximity receiver electrodes (314) are capacitively coupled to adjacent proximity transmitter segments (316). The capacitive coupling is an intentional coupling to transfer energy from the proximity transmitter segment to the adjacent proximity receiver electrode.

A proximity transmitter segment is a portion of a transmitter electrode that is arranged for proximity detection. The proximity transmitter segment, as is the rest of the transmitter electrode, is composed of conductive material and is connected via traces to the processing system. The proximity transmitter segment is configured to transmit a transmitter signal that is received by the proximity receiver electrode. The transmitter signal received by the proximity receiver electrode is affected by any input object in the sensing region. Further, the arrangement of proximity receiver electrodes and proximity transmitter segments is organized to determine positional information for one or more input objects in the sensing region. Specifically, by being adjacent to the film and the input surface, input objects within a distance to the input surface affect the electrical field created by the transmitter signal from the proximity transmitter electrodes and detected by the proximity receiver electrode.

The second single layer (312) is configured to perform force sensing to obtain force information. The second single layer (312) includes force receiver electrodes (318) and force transmitter segments (320). Force receiver electrodes (318) are electrodes composed of conductive material that are connected via conductive traces to the processing system. In one or more embodiments, the force receiver electrodes (318) are entirely located on the second single layer (312). The force receiver electrodes (318) are capacitively coupled to adjacent force transmitter segments (320) located on the second single layer. The capacitive coupling is an intentional coupling to transfer energy from the force transmitter segment to the adjacent force receiver electrode.

A force transmitter segment is a portion of a transmitter electrode that is arranged for force detection. The force transmitter segment is configured to transmit a transmitter signal that is received by the force receiver electrode. The transmitter signal received by the force receiver electrode is affected by force applied to the input surface (202). Specifically, the arrangement of force receiver electrodes, compressible layer (308), and ground plane (304) causes the electric field caused by the transmitter signals to be affected by force applied to the input surface.

Interposed between the second single layer (312) and the ground plane (304) is the compressible layer (308) having compressible material (322). The compressible layer is designed to compress, such that the second single layer is physically closer to the ground plane (304) when the compressible layer is in a compressed state as compared to being in a non-compressed state. For example, the compressible material (322) may be rubber (e.g., silicon rubber), air gap (e.g., created by sheet metal design, such as a sheet metal spring), sponge material, or other compressible material. Because of the compression of the compressible material the second single layer (312) is closer to the ground plane (304) causing the electric field created by the transmitter signal and detected by the force receiver electrodes to be reduced.

As further shown in FIG. 3, the compressible layer (308) may further include floating electrodes (324) that are interposed between the second single layer (312) and the compressible material (322). The floating electrodes (324) may be embedded in the compressible material (322) or above the compressible material (322). In one or more embodiments, each floating electrode (324) is vertically adjacent to the force receiver electrodes (318) and force transmitter segment (320). A floating electrode (324) is a piece of conductive material that is not physically connected to other conductive material (i.e., not connected to traces). Rather, a floating electrode (324) has insulative material surrounding the floating electrode (324). The floating electrode (324) is capacitively coupled to the force receiver electrode (318), the force transmitter segment (320), and the ground (328) that is adjacent to the floating electrode (324). By being capacitively coupled to both the force transmitter segment (320) and the force receiver electrode (318), the floating electrode (324) enhances the force signal detected by the force receiver electrode (318).

As further shown in FIG. 3, interposed between the first single layer (310) and the second single layer (312) is a first insulation layer (326). The first insulation layer is made of insulative material. Further, a second insulation layer (321) is interposed between the second single layer and the compressible layer (308).

The first single layer (310) further includes first ground shield (328) to shield the force receiver electrodes (318) from the electrical components of the first single layer. The first ground shield (328) is composed of conductive material and is connected to system ground.

The second single layer (312) includes second ground shield (330) to shield the proximity receiver electrodes (314) from the electrical components of the second single layer (312). The second ground shield (330) may be electrically coupled to the first ground shield (328) as shown by the lines between the second ground shield (330) and the first ground shield (328). In particular, the first ground shield (328) and the second ground shield (330) may be composed of grounding segments. The grounding segments of the first ground shield may be connected to the grounding segments of the second ground shield to connect the grounding of the first layer to the grounding of the second layer.

Further, as shown by the lines between the layers in FIG. 3, a set of proximity transmitter segments (316) and a set of force transmitter segments (320) are electrically connected to form a transmitter electrode. In other words, a transmitter electrode is a set of proximity transmitter segments and force transmitter segments that are electrically connected as shown by the lines between the first single layer and the second single layer. The electrical connection may be via holes in the first insulation layer (324) and direct physical connection between the proximity transmitter segments and force transmitter segments belonging to the same transmitter electrode. For example, as shown in FIGS. 7-11, the transmitter electrode may extend along an axis of the sensing region and be an alternating pattern of proximity transmitter segments and force transmitter segments along the axis (e.g., the set of collinear transmitter segments). The transmitter electrode may be connected via conductive traces to the processing system.

Figure 4:
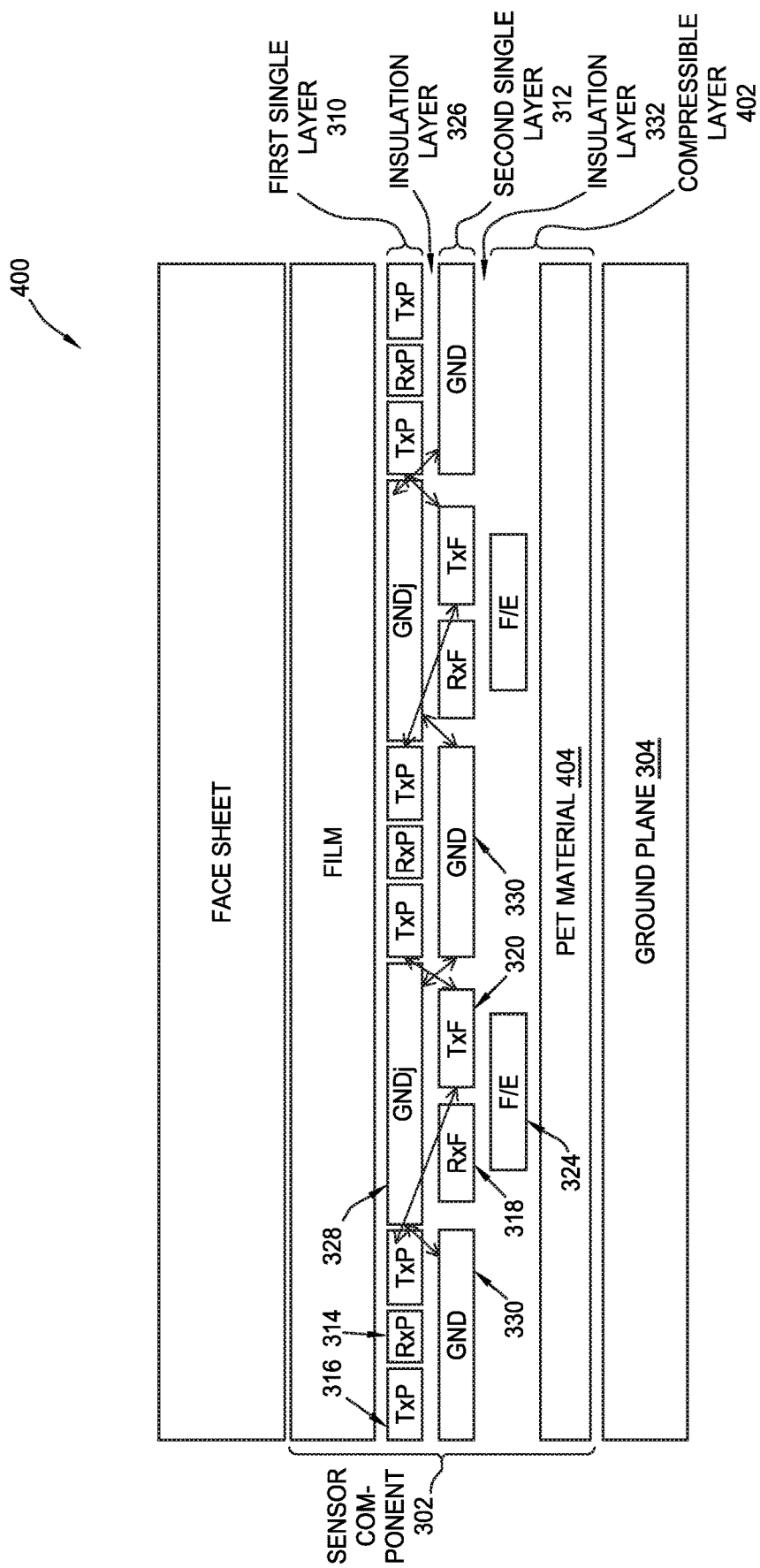
FIG. 4 is a block diagram of a side view of an example input device in accordance with an embodiment of the disclosure.
Figure 6:
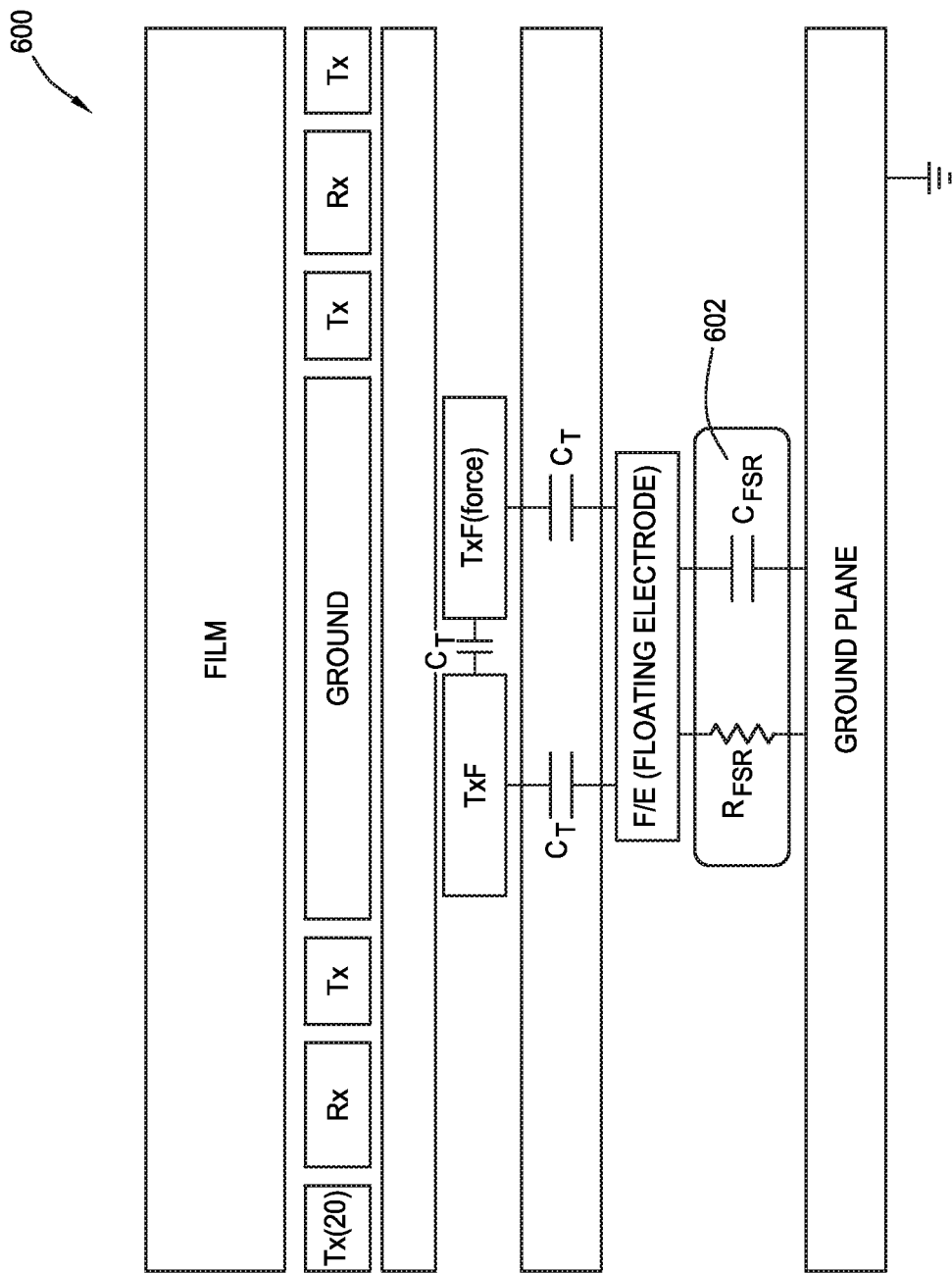
FIG. 6 is an electrical block diagram of a side view of an example input device in accordance with an embodiment of the disclosure.

Turning to FIG. 4, FIG. 4 is a block diagram of a side view of an example input device (400) in accordance with an embodiment of the disclosure. In FIG. 4, components having the same numbering as the components shown in FIG. 3 are the same as described above with reference to FIG. 3. As shown in FIG. 6, the compressible layer (402) includes a layer of piezoelectric material (404). For example, the piezoelectric material may be a layer of piezoelectric ink. Piezoelectric ink generates a charge when compressed. Thus, the charge affects the resulting signal received by the force receiver electrode (318). The piezoelectric ink may replace all or part of the compressible material in FIG. 3. Further, in some embodiments, the floating electrodes (324) are omitted when piezoelectric ink is used.

Figure 5:
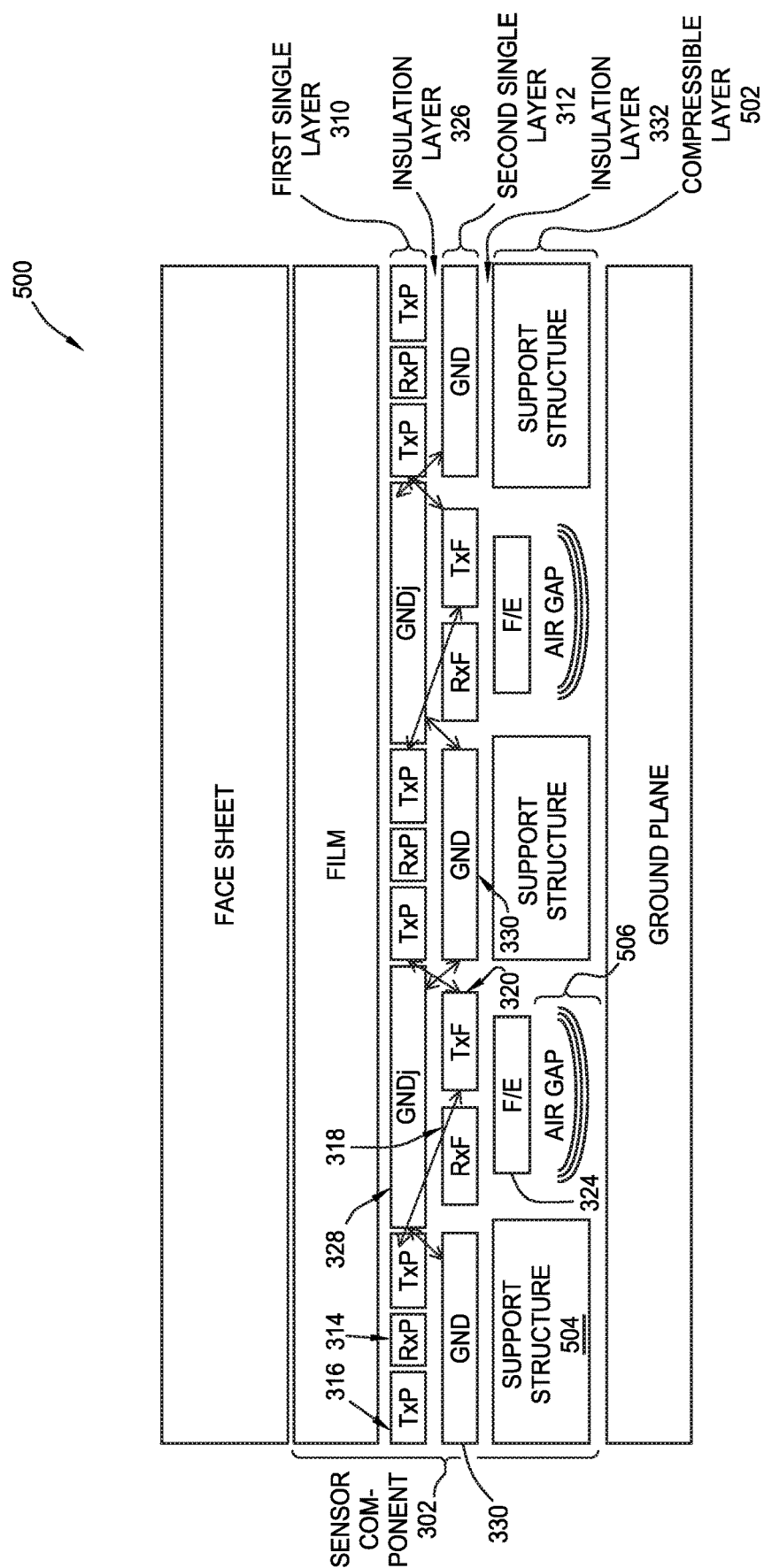
FIG. 5 is a block diagram of a side view of an example input device in accordance with an embodiment of the disclosure.

Turning to FIG. 5, FIG. 5 is a block diagram of a side view of an example input device (500) in accordance with an embodiment of the disclosure. In FIG. 5, components having the same numbering as the components shown in FIG. 3 are the same as described above with reference to FIG. 3.

As shown in FIG. 5, the example input device (500) includes a variation of a compressible layer (502) in which support structures (504) are interleaved with the floating electrodes (324). In particular, the support structures (330) are between the second ground shield and the ground plane (304). In one or more embodiments, the support structures are composed of rubber. However, other compressible material, such as sponge may be used. The floating electrodes (324) are between the coupled force receiver electrode (318) and the force transmitter segment (320) and the ground plane (304). Air gap (506) may be between the floating electrodes (324) and the ground plane (304).

In the embodiment of FIG. 5, when force is applied to the input surface (202), the support structures (504) deform causing the air gap (506) to be reduced. Accordingly, the ground plane (304) has a greater effect on the electrical field between the force transmitter segments and the force receiver electrodes.

FIG. 6 is an electrical block diagram of a side view of an example input device in accordance with an embodiment of the disclosure. The components of FIG. 6 that have the same number as in FIG. 3 and/or FIG. 5 are the same as the like numbered components in FIG. 3 and/or FIG. 5.

In the embodiment shown in FIG. 6, force sensing resistor (FSR) ink (602) replaces the air gap in FIG. 5. Thus, as shown in FIG. 6 and described above, a trans capacitive coupling (CT) exists between the force transmitter segment (320) and the adjacent force receiver electrode (318), between the force transmitter segment (320) and the floating electrode (324), and between the force receiver electrode (318) and the floating electrode (324). The FSR capacitive coupling (CFSR) exists through the FSR ink (602) and between the floating electrode (324) and the ground plane (304). FSR ink (602) is ink whose resistance (RFSR) changes when force is applied. Using the FSR ink (602), the trans capacitance between the force receiver electrode (318) and the force transmitter segment (320) is reduced when force is applied to the input surface (202) as compared to when no force is applied to the input surface (202). In particular, charge is attracted to the FSR ink (602) because the FSR ink is connected to the ground plane (304).

Figure 7:
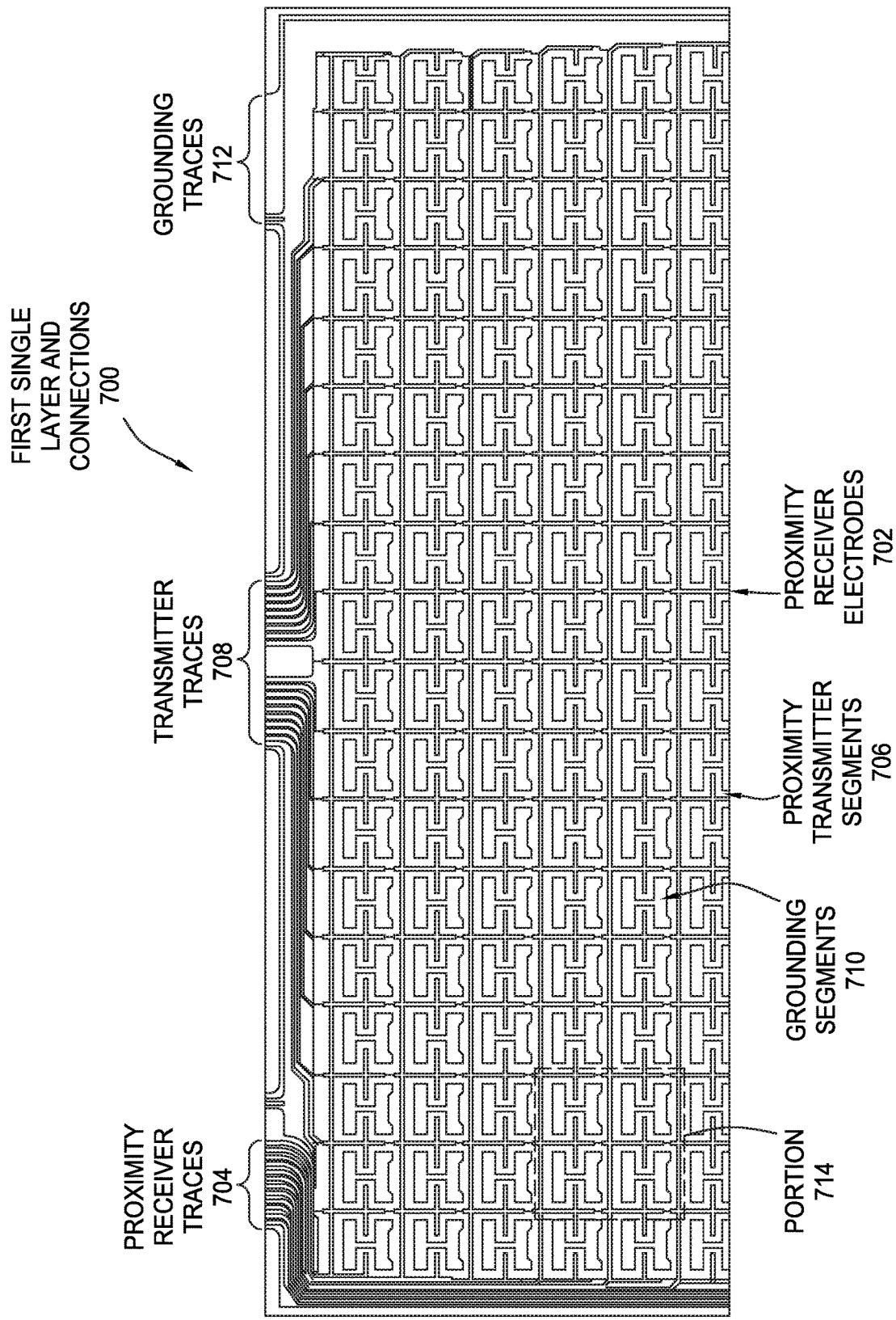
FIG. 7 is a top view diagram of a portion of the first single layer in accordance with an embodiment of the disclosure.

FIG. 7 is a top view diagram of a portion of the first single layer (700) in accordance with an embodiment of the disclosure. In FIG. 7, the proximity receiver electrodes are the t-shaped lines and the main line connected to the t-shaped lines and extending across the sensing region. Each connected line in the same row corresponds to a proximity receiver electrode. The proximity receiver electrodes (702) are electrically and physically connected to proximity receiver traces (704). The proximity receiver traces (704) connect the corresponding receiver electrodes to the processing system (not shown). The proximity receiver electrodes (706) are entirely located in the same single layer.

Adjacent to and within the space created by adjacent t-shaped lines, are the proximity transmitter segments (706). As shown, the proximity transmitter segment (706) is a polygon that is an outline of an H-shaped structure. As shown in FIG. 7, on the first single layer (700), the proximity transmitter segments (706) are disjointed. In one or more embodiments shown in FIG. 7, a column of proximity transmitter segments (706) are part of a same single transmitter electrode. Through the second single layer (not shown), the proximity transmitter segments (706) connect through the force transmitter segments (not shown) to the transmitter traces (708). The transmitter traces (708) connect the transmitter electrodes, including the proximity transmitter segments, to the processing system (not shown).

The H-Shaped structure within the proximity transmitter segments (706) are grounding segments (710) of the first ground shield. As shown, each grounding segment (710) is within a single corresponding proximity transmitter segment (706). The grounding segments (710) on the first single layer are connected through grounding segments on the second single layer to grounding traces (712). The grounding traces (712) connect the ground shields to the system ground.

Figure 8:
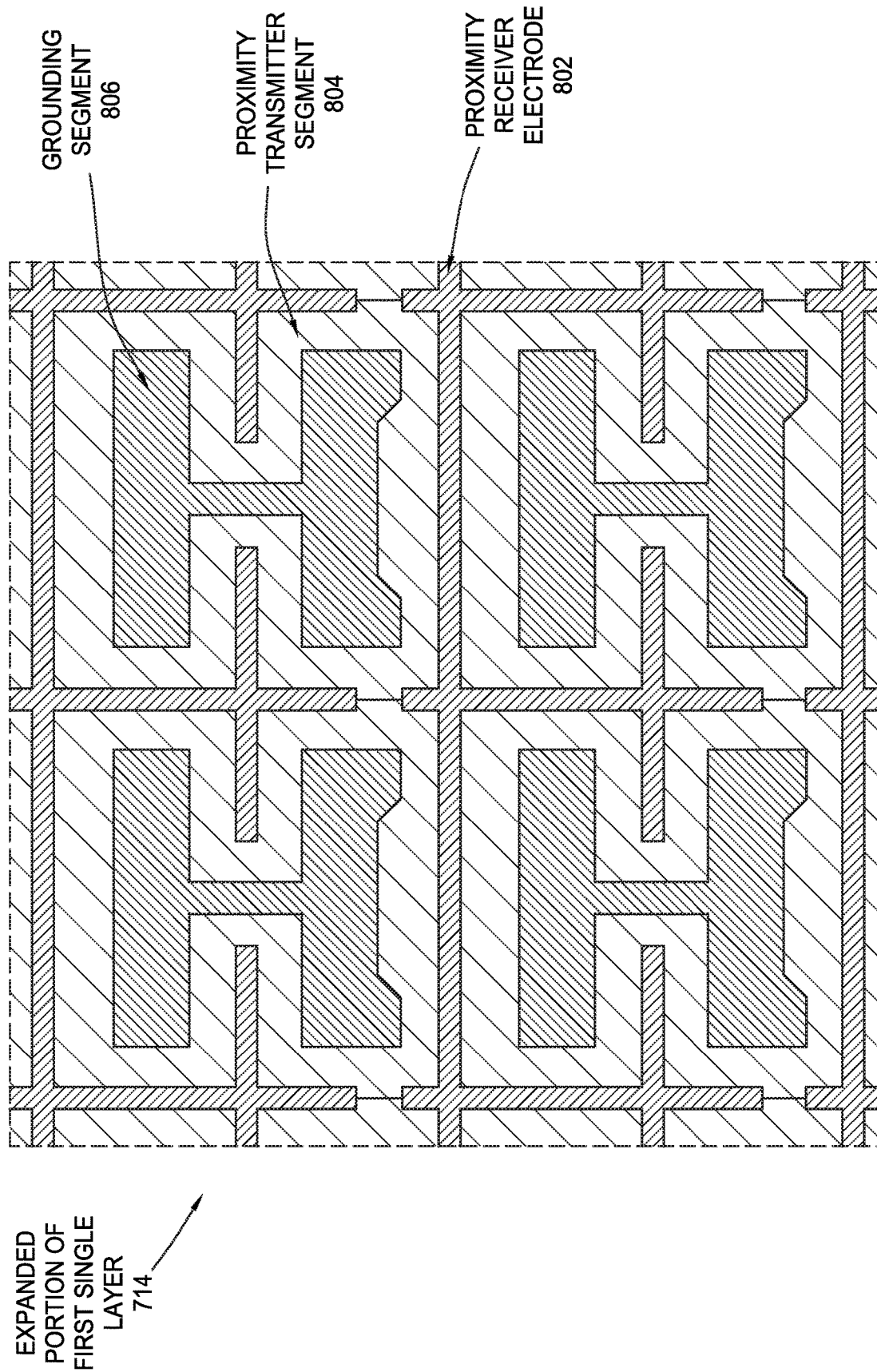
FIG. 8 is an expanded top view diagram of the portion of the first single layer in accordance with an embodiment of the disclosure.

FIG. 8 is an expanded top view diagram of the portion (714) of the first single layer (700) in accordance with an embodiment of the disclosure. As shown in expanded portion (714) of FIG. 8, the proximity receiver electrode (802) is directly adjacent to the proximity transmitter segment (804). The surface area in which the proximity receiver electrode (802) and the proximity transmitter segment (804) are adjacent corresponds to the area of capacitive coupling. Further, as shown in FIG. 4, grounding segments (806) are within the proximity transmitter segment (804).

Figure 9:
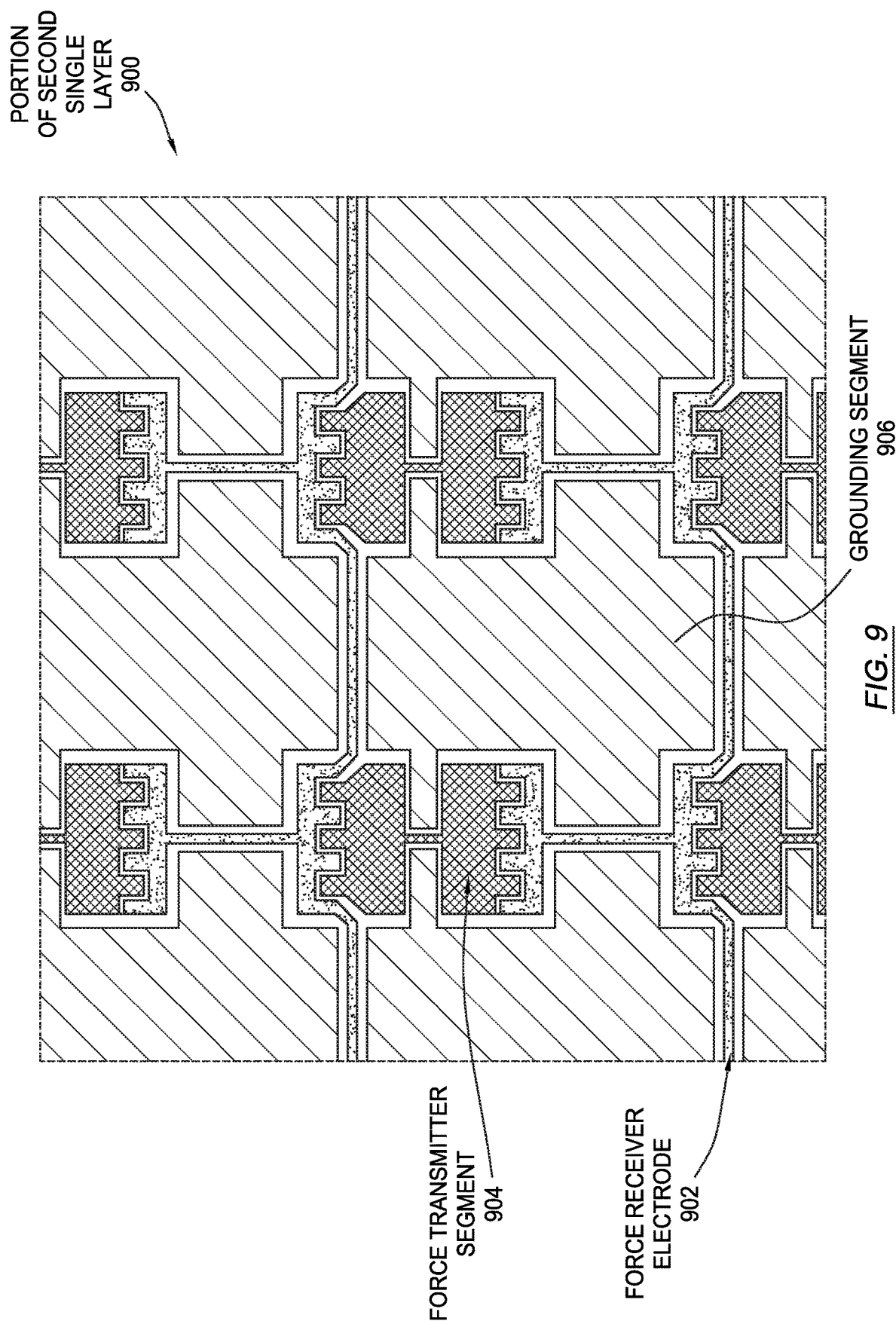
FIG. 9 is an expanded top view diagram of a portion of the second single layer in accordance with an embodiment of the disclosure.

FIG. 9 is an expanded top view diagram of an expanded portion (900) of the second single layer in accordance with an embodiment of the disclosure. The expanded portion of the second single layer (900) directly overlays the expanded portion of the first single layer described above with reference to FIG. 8.

In FIG. 9, the force receiver electrodes (902) are the shapes that are entirely within the second single layer. The force receiver electrodes (902) extend along the same axis as the proximity receiver electrodes. As shown, each force receiver electrode (902) is a series of capital T-Shaped designs extending along the same line. Further, as shown, the two ends of the T-Shape may be a comb structure in accordance with one or more embodiments. In such embodiments, the force transmitter segments (904) are disjoint H-Shaped segments having inverse comb structures on either end as shown. The surface area in which the comb structure of the force receiver electrode (902) and the inverse comb structure of force transmitter segment (904) are adjacent is an area of capacitive coupling. As shown, the comb structure and the inverse comb structure increase the capacitive coupling between the force receiver electrode (902) and the force transmitter segment (904). The structure shown in FIG. 9 is only an embodiment. Other structures may be used without departing from the scope of the disclosure.

As shown in FIG. 9, disjoint areas exist as created by the force transmitter segments (904) and the force receiver electrodes (902). Grounding segments (906) may be in the regions to substantially shield the proximity receiver electrodes on the first single layer from the force transmitter segments and the force receiver electrodes.

Figure 10:
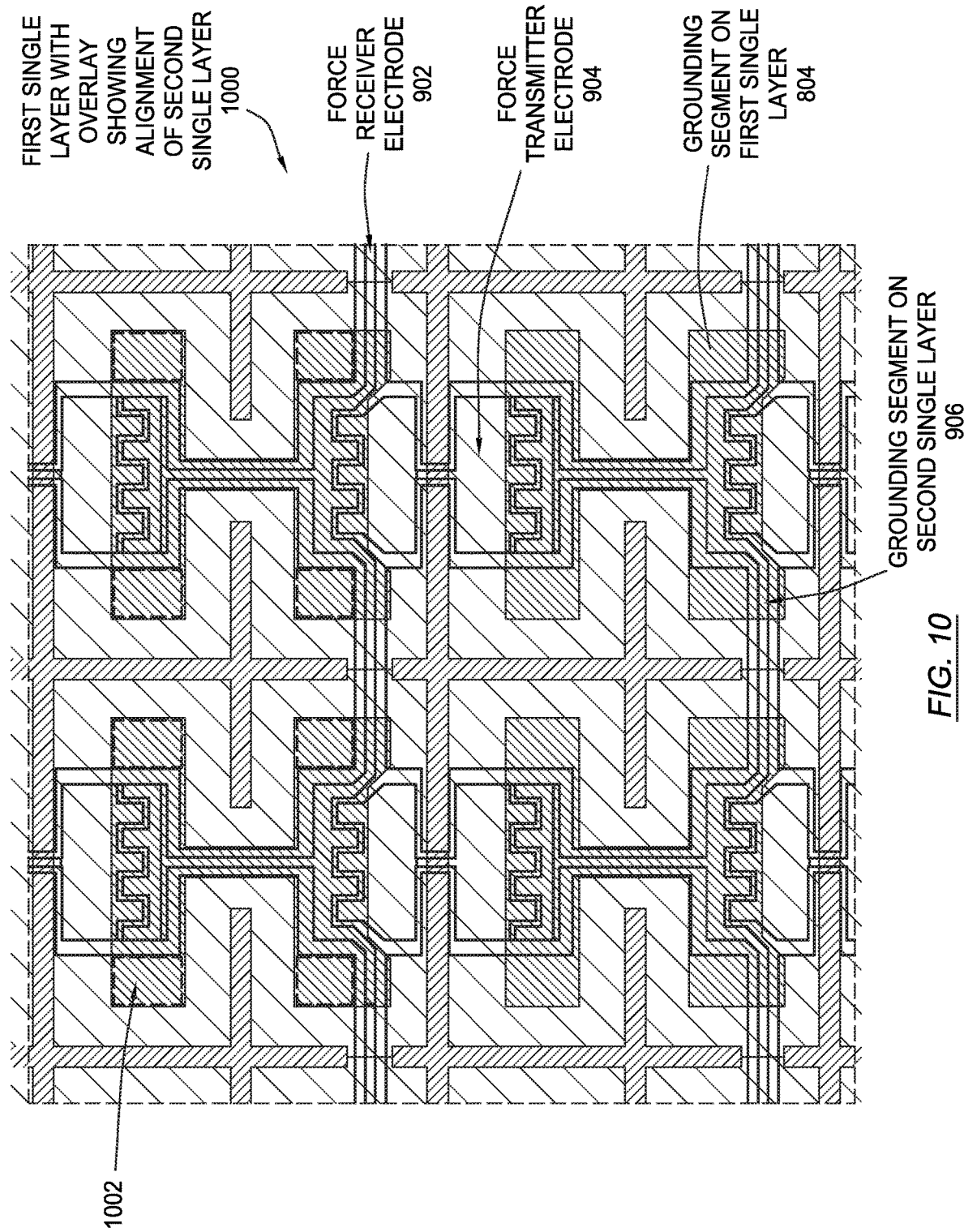
FIG. 10 is an expanded top view diagram of the portion of the first single layer with the second layer overlaid in accordance with an embodiment of the disclosure.

FIG. 10 is an expanded top view diagram of the portion of the first single layer with the second layer overlaid (1000) in accordance with an embodiment of the disclosure. In particular FIG. 10 is the same as an outline of FIG. 9 overlaid onto FIG. 8. The overlaid components as denoted by the outlining are marked with the like named components of FIG. 9. The top row of FIG. 10 further includes dashed boxes (1002) to demonstrate where the grounding segments overlay a portion of the grounding segments of the second single layer. Through holes in the insulative material between the first single layer and the second single layer at the locations of the dashed boxes and using additional conductive material, a row of grounding segments may be physically and electrically connected to each other. The same connections may exist for the bottom row of FIG. 10 and so forth.

Further, as shown in FIG. 10, the ground shield formed by grounding segments (806) on the first single layer substantially overlap the force receiver electrodes (902) on the second single layer. The substantial overlap is an overlap of greater than 70% or 80%, depending on pitch, in accordance with one or more embodiments.

Figure 11:
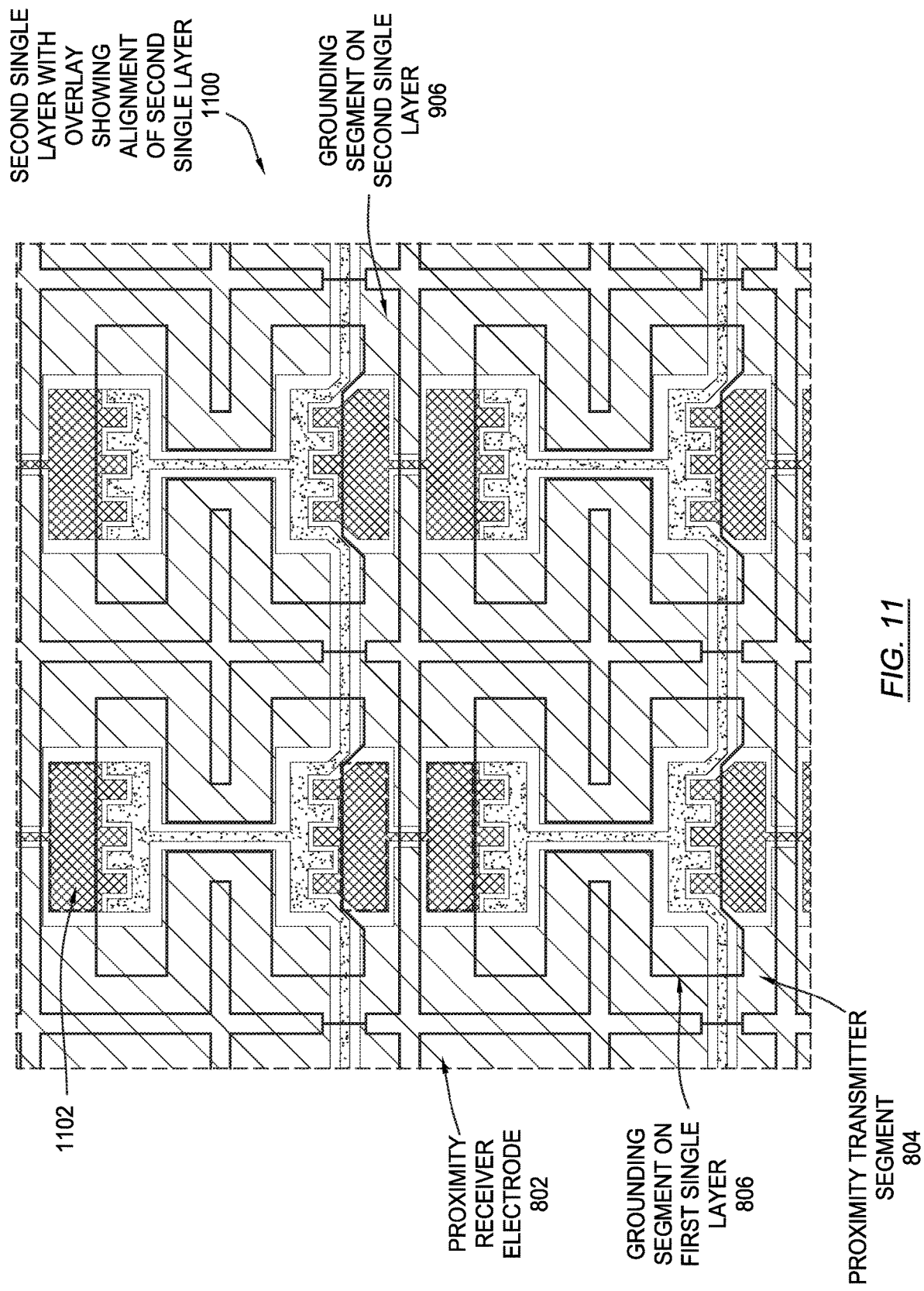
FIG. 11 is an expanded top view diagram of the portion of the second single layer with the first layer overlaid in accordance with an embodiment of the disclosure.

FIG. 11 is an expanded top view diagram of the portion of the second single layer with the first layer overlaid (1100) in accordance with an embodiment of the disclosure. Specifically, FIG. 11 is the same as an outline of FIG. 8 overlaid onto FIG. 9. The overlaid components as denoted by the outlining are marked with the like named components of FIG. 8. The left column of FIG. 11 further includes dashed boxes (1102) to demonstrate where the force transmitter segments overlay a portion of the proximity transmitter segments of the first single layer. Through holes in the insulative material between the first single layer and the second single layer at the locations of the dashed boxes and using additional conductive material, a column of transmitter segments may be physically and electrically connected to each other. The same connections may exist for the right column of FIG. 11 and so forth.

Further, as shown in FIG. 11, the ground shield formed by grounding segments (906) on the second single layer substantially overlap the proximity receiver electrodes (802) on the second single layer. The substantial overlap is an overlap of greater than 70% or 80%, depending on pitch, in accordance with one or more embodiments.

Figure 12:
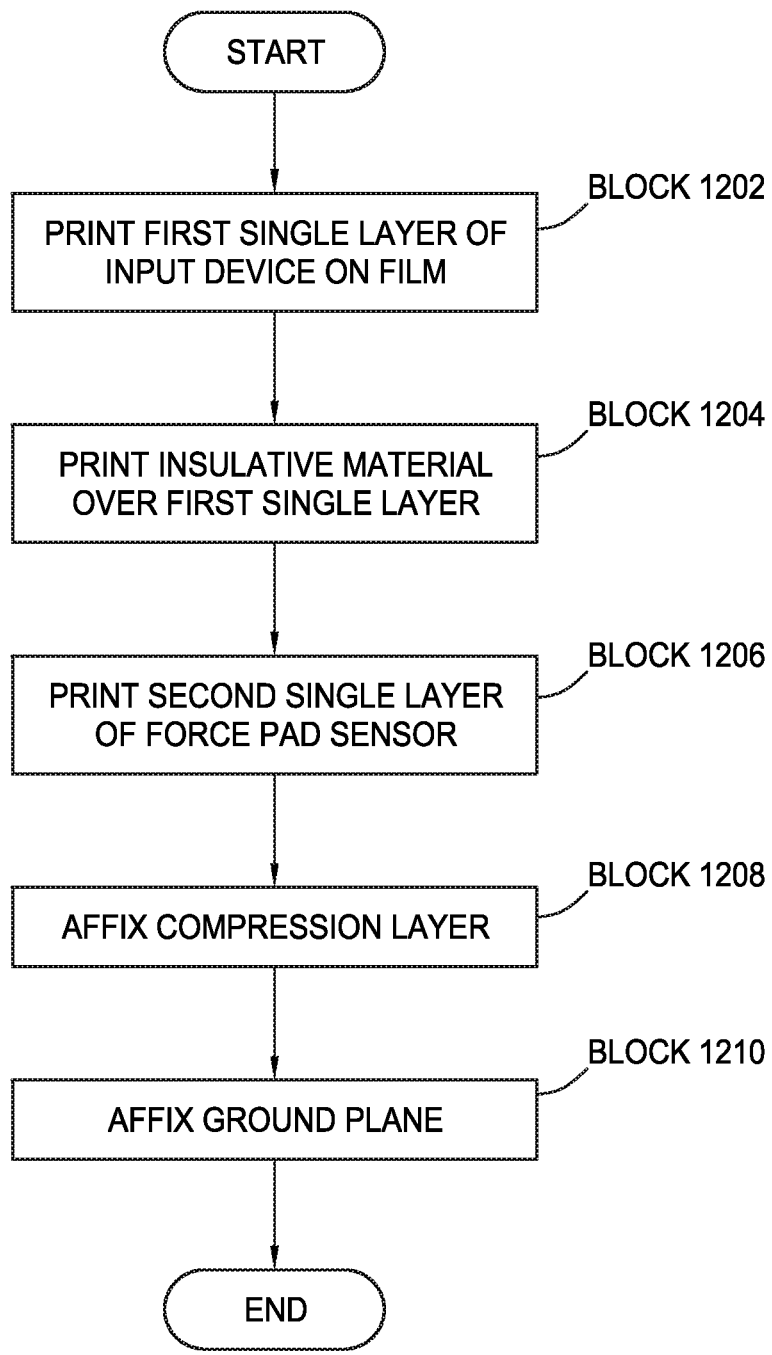
FIG. 12 is a flowchart for manufacturing an input device in accordance with one or more embodiments of the disclosure.

FIG. 12 is a flowchart for manufacturing an input device in accordance with one or more embodiments of the disclosure. In Block 1202, a first single layer is printed on film. The film may have a stiffener added to the film on the side closes to the input surface. On the opposing side, silver or other conductive ink may be applied to form the proximity receiver electrodes, the proximity transmitter segments, and the grounding segments.

In Block 1204, insulative material is printed over the first single layer. For example, insulation ink may be printed over the first single layer.

In Block 1206, a second single layer is printed over the insulative material. Silver or other conductive ink may be printed in the pattern to form the force receiver electrodes, the force transmitter segments and the grounding segments.

In Block 1208, a compressible layer is affixed to the input device. Insulative ink may be printed over the second single layer. Carbon ink may be printed in the pattern of the floating electrodes over the insulative ink. Dots and adhesive may be added over the pattern of floating electrodes. For example, the dots may include spacer dots interleaved within the pattern of floating electrodes and adhesive dots affixed to the spacer dots.

In Block 1210, a ground plane is affixed to the input device. The ground plane may be a ground plate affixed to the adhesive material or conductive ink printed over the compressible layer.

The various printed components may be connected to the processing system. In particular, conductive traces may be added to connect the sensor to the processing system.

Thus, the embodiments and examples set forth herein were presented in order to best explain various embodiments and the particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A input device sensor comprising:
   a plurality of proximity receiver electrodes on a first single layer;
   a plurality of force receiver electrodes on a second single layer;
   a plurality of transmitter electrodes configured to transmit a transmitter signal, each transmitter electrode comprising:
      a plurality of proximity transmitter segments linearly arranged on the first single layer and separated by the plurality of proximity receiver electrodes, the plurality of proximity transmitter segments capacitively coupled to the plurality of proximity receiver electrodes;
      a plurality of force transmitter segments linearly arranged on the second single layer and separated by the plurality of force receiver electrodes, the plurality of force transmitter segments connecting adjacent proximity transmitter segments in the plurality of proximity transmitter segments, the plurality of force transmitter segments capacitively coupled to the plurality of force receiver electrodes;
   a first ground shield on the first single layer, the first ground shield shielding the plurality of force receiver electrodes from the plurality of proximity transmitter segments;
   a ground plane; and
   a compressible layer interposed between the second single layer and the ground plane.

2. The input device sensor of claim 1, wherein the first single layer and the second single layer are printed on a film.

3. The input device sensor of claim 2, wherein the film is a Polyethylene Terephthalate (PET) substrate.

4. The input device sensor of claim 1, further comprising:
   a second ground shield on the second single layer shielding the plurality of proximity receiver electrodes from the plurality of force transmitter segments.

5. The input device sensor of claim 1, further comprising:
a plurality of floating electrodes in a third layer between the second single layer and the ground plane, the plurality of floating electrodes capacitively coupled to the plurality of force receiver electrodes.

6. The input device sensor of claim 5, wherein the third layer comprises a plurality of rubber support structures interleaved with the plurality of floating electrodes.

7. The input device sensor of claim 5, further comprising force sensing resistor (FSR) ink interposed between the ground plane and the plurality of floating electrodes.

8. The input device sensor of claim 5, wherein the third layer is within the compressible layer.

9. The input device sensor of claim 1, wherein the first ground shield comprises a plurality of grounding segments, the plurality of grounding segments being within the plurality of proximity transmitter segments, the plurality of grounding segments substantially overlapping the plurality of force receiver electrodes.

10. The input device sensor of claim 1, wherein the plurality of force receiver electrodes comprises a comb structure, wherein the plurality of force transmitter segments comprises an inverse comb structure, and wherein the plurality of force receiver electrodes and the plurality of force transmitter electrodes comprises a capacitive coupling along the comb structure and the inverse comb structure.

11. The input device sensor of claim 1, wherein the compressible layer comprises:
a compressible material extending along the ground plane.

12. The input device sensor of claim 1, wherein the compressible layer comprises piezoelectric ink.

13. The input device sensor of claim 1, further comprising:
insulative ink between the first layer and the second layer.

14. A method for manufacturing an input device sensor comprising:
printing, on a film, a first single layer comprising:
a plurality of proximity receiver electrodes,
a plurality of proximity transmitter segments separated by the plurality of proximity receiver electrodes, the plurality of proximity transmitter segments capacitively coupled to the plurality of proximity receiver electrodes, and
a first ground shield;
printing, on the film, a second single layer, the second single layer comprising:
a plurality of force receiver electrodes, wherein the plurality of force receiver electrodes is shielded from the plurality of proximity transmitter segments, and
a plurality of force transmitter segments and separated by the plurality of force receiver electrodes, the plurality of force transmitter segments connecting adjacent proximity transmitter segments in the plurality of proximity transmitter segments, the plurality of force transmitter segments capacitively coupled to the plurality of force receiver electrodes; and
affixing, to the input device sensor, a ground plane and a compressible layer interposed between the second single layer and the ground plane.

15. The method of claim 14, wherein printing the second single layer comprises:
printing a second ground shield shielding the plurality of proximity receiver electrodes from the plurality of force transmitter segments.

16. The method of claim 14, further comprising:
printing a third layer comprising a plurality of floating electrodes between the second single layer and the ground plane, the plurality of floating electrodes capacitively coupled to the plurality of force receiver electrodes.

17. The method of claim 16, further comprising:
affixing a plurality of rubber support structures interleaved with the plurality of floating electrodes in the third layer.

18. The method of claim 16, further comprising:
printing force sensing resistor (FSR) ink interposed between the ground plane and the plurality of floating electrodes.

19. The method of claim 16, wherein affixing the compressible layer comprising:
printing piezoelectric ink as at least part of the compressible layer.

20. An input device comprising:
an input surface;
an input device sensor comprising:
a plurality of proximity receiver electrodes on a first single layer;
a plurality of force receiver electrodes on a second single layer;
a plurality of transmitter electrodes configured to transmit a transmitter signal, each transmitter electrode comprising:
a plurality of proximity transmitter segments linearly arranged on the first single layer and separated by the plurality of proximity receiver electrodes, the plurality of proximity transmitter segments forming a first capacitive coupling with the plurality of proximity receiver electrodes;
a plurality of force transmitter segments linearly arranged on the second single layer and separated by the plurality of force receiver electrodes, the plurality of force transmitter segments connecting adjacent proximity transmitter segments in the plurality of proximity transmitter segments, the plurality of force transmitter segments forming a second capacitive coupling with the plurality of force receiver electrodes;
a first ground shield on the first single layer, the first ground shield shielding the plurality of force receiver electrodes from the plurality of proximity transmitter segments;
a ground plane;
a compressible layer interposed between the second single layer and the ground plane,
wherein the first single layer and the second single layer are printed on a film; and
a processing circuitry configured to:
determine positional information of an input object proximate to the input surface based on the first capacitive coupling, and
determine a force applied to the input surface based on the second capacitive coupling.

* * * * *